(12) United States Patent
Hung et al.

(10) Patent No.: US 10,833,048 B2
(45) Date of Patent: Nov. 10, 2020

(54) NANOWIRE ENABLED SUBSTRATE BONDING AND ELECTRICAL CONTACT FORMATION

(71) Applicant: INTERNATIONAL BUSINESS MACHINES CORPORATION, Armonk, NY (US)

(72) Inventors: Li-Wen Hung, Mahopac, NY (US); Reinaldo Vega, Mahopac, NY (US); Hari Mallela, Poughquag, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 54 days.

(21) Appl. No.: 15/950,239

(22) Filed: Apr. 11, 2018

(65) Prior Publication Data

US 2019/0319006 A1 Oct. 17, 2019

(51) Int. Cl.
*H01L 23/00* (2006.01)

(52) U.S. Cl.
CPC ............. *H01L 24/80* (2013.01); *H01L 24/05* (2013.01); *H01L 24/08* (2013.01); *H01L 2224/05017* (2013.01); *H01L 2224/08148* (2013.01); *H01L 2224/80201* (2013.01); *H01L 2224/80345* (2013.01); *H01L 2224/80894* (2013.01)

(58) Field of Classification Search
CPC .......... H01L 24/26–33; H01L 25/0657; H01L 25/074
See application file for complete search history.

(56) References Cited

U.S. PATENT DOCUMENTS

| | | | |
|---|---|---|---|
| 6,297,063 B1 * | 10/2001 | Brown | H01L 23/49877 257/E21.705 |
| 7,056,409 B2 | 6/2006 | Dubrow | |
| 7,112,525 B1 | 9/2006 | Bhansali et al. | |
| 7,268,423 B2 * | 9/2007 | Beer | B82Y 10/00 257/688 |
| 7,301,779 B2 | 11/2007 | Honlein et al. | |
| 7,439,731 B2 | 10/2008 | Crafts et al. | |
| 7,633,148 B2 * | 12/2009 | Awano | H01L 21/6835 257/690 |
| 7,960,653 B2 * | 6/2011 | Wang | B82Y 10/00 174/126.2 |
| 8,017,498 B2 | 9/2011 | Supriya et al. | |

(Continued)

OTHER PUBLICATIONS

Ju Xu et al.,"The fabrication of ultra long metal nanowire bumps and their application as interconnects," 12th IEEE Conference on Nanotechnology, IEEE-NANO, 2012, 6 pages.

(Continued)

*Primary Examiner* — Bryan R Junge
(74) *Attorney, Agent, or Firm* — Cantor Colburn LLP

(57) ABSTRACT

A technique relates to a semiconductor device. First nanowires are formed on a first substrate, the first nanowires being electrically coupled to one or more first electrical sites on the first substrate. Second nanowires are formed on a second substrate, the second nanowires being electrically coupled to one or more second electrical sites on the second substrate. The first nanowires and the second nanowires are electrically coupled such that the one or more first electrical sites are electrically coupled to the one or more second electrical sites.

20 Claims, 6 Drawing Sheets

(56) References Cited

U.S. PATENT DOCUMENTS

| | | | | |
|---|---|---|---|---|
| 8,610,290 B2* | 12/2013 | Autumn | ................. | H01L 24/11 |
| | | | | 257/783 |
| 9,468,989 B2 | 10/2016 | Starkovich et al. | | |
| 9,871,014 B2* | 1/2018 | Haba | ................. | H01L 24/29 |
| 2003/0189202 A1* | 10/2003 | Li | ................. | B82Y 10/00 |
| | | | | 257/14 |
| 2005/0224975 A1* | 10/2005 | Basavanhally | ....... | B81B 7/0006 |
| | | | | 257/741 |
| 2006/0068195 A1* | 3/2006 | Majumdar | .............. | B32B 37/00 |
| | | | | 428/323 |
| 2006/0243958 A1* | 11/2006 | Suh | ............. | C09J 7/22 |
| | | | | 257/10 |
| 2007/0099006 A1 | 5/2007 | Ingman et al. | | |
| 2009/0072408 A1* | 3/2009 | Kabir | ................. | H01L 24/83 |
| | | | | 257/773 |
| 2013/0234313 A1* | 9/2013 | Wainerdi | ................ | H01L 24/29 |
| | | | | 257/706 |
| 2014/0246770 A1* | 9/2014 | Jha | ................ | H01L 23/3736 |
| | | | | 257/712 |
| 2017/0162436 A1* | 6/2017 | Arvin | ................ | H01L 25/0657 |

OTHER PUBLICATIONS

Peng Wang et al., "Room-temperature electrical bonding technique based on copper/polystyrene core/shell nanowire surface fastener," Applied Surface Science, vol. 349, 2015, pp. 774-779.

Yang Ju et al., "Mechanical and electrical cold bonding based on metallic nanowire surface fasteners," Nanotechnology, vol. 23, No. 36, 2012, 365202, 6 pages.

* cited by examiner

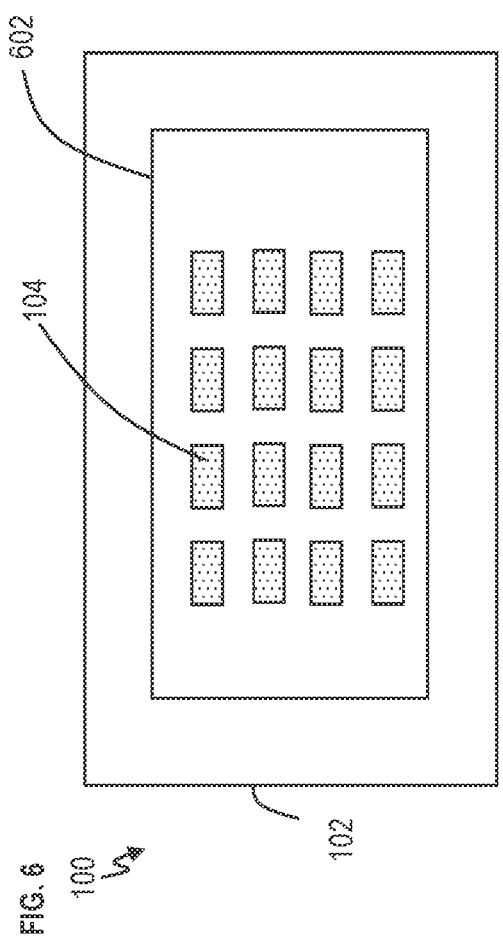
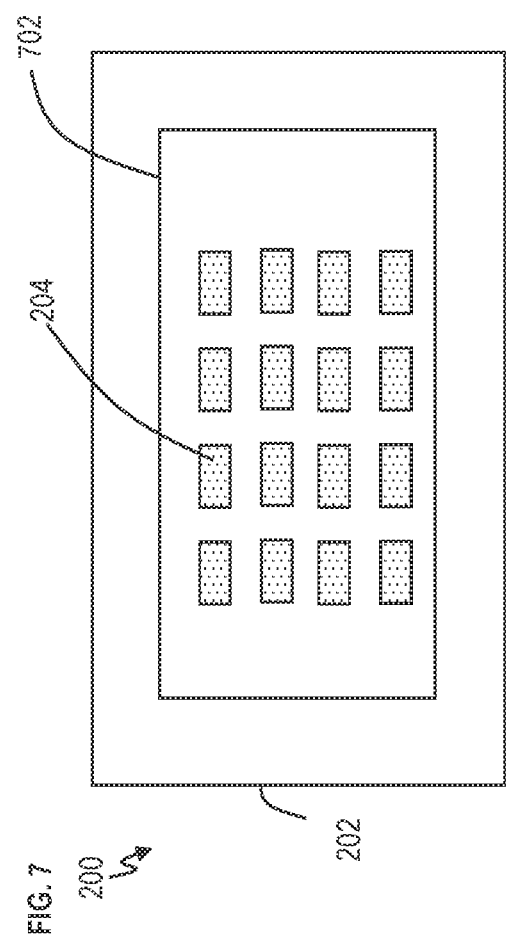

NANOWIRE ENABLED SUBSTRATE BONDING AND ELECTRICAL CONTACT FORMATION

BACKGROUND

The present invention generally relates to fabrication methods and resulting structures for semiconductor devices, and more specifically, to nanowire enabled substrate bonding and electrical contact formation.

Wafer bonding is a wafer-level packaging technology for the fabrication of microelectronics, microelectromechanical systems (MEMS), nanoelectromechanical systems (NEMS), optoelectronics, semiconductors, etc. There can be different types of bonding techniques used to join one substrate to another. In general, wafer bonding requires specific conditions for the substrate surface, the bonding environment, and the materials. The conditions for the substrate surface include flatness, smoothness, and cleanliness. The conditions for the bonding environment include bond temperature, ambient pressure, and applied force. The materials include substrate materials and intermediate layer materials.

SUMMARY

Embodiments of the invention are directed to a semiconductor device. A non-limiting example of the semiconductor device includes first nanowires on a first substrate, the first nanowires electrically coupled to one or more first electrical sites on the first substrate. Also, the semiconductor device includes second nanowires on a second substrate, the second nanowires electrically coupled to one or more second electrical sites on the second substrate. The first substrate opposes the second substrate such that the first nanowires at the one or more first electrical sites are electrically connected to the second nanowires at the one or more second electrical sites.

Embodiments of the invention are directed to a method for fabricating a semiconductor device. A non-limiting example of the method includes forming first nanowires on a first substrate, the first nanowires being electrically coupled to one or more first electrical sites on the first substrate. The method includes forming second nanowires on a second substrate, the second nanowires being electrically coupled to one or more second electrical sites on the second substrate. Also, the method includes electrically coupling the first nanowires and the second nanowires such that the one or more first electrical sites are electrically coupled to the one or more second electrical sites.

Embodiments of the invention are directed to a method for fabricating a semiconductor device. A non-limiting example of the method includes providing a first device having first nanowires on a first substrate, the first nanowires being electrically coupled to one or more first electrical sites on the first substrate. The method includes providing a second device having second nanowires on a second substrate, the second nanowires being electrically coupled to one or more second electrical sites on the second substrate. Also, the method includes joining the first nanowires and the second nanowires such that the one or more first electrical sites are electrically coupled to the one or more second electrical sites.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 6 depicts a simplified diagram depicting a top view of a semiconductor device illustrating bonding sites on an electrical circuit according to embodiments of the invention; and FIG. 7 depicts a simplified diagram depicting a top view of a semiconductor device having bonding sites on an electrical circuit according to embodiments of the invention.

Figure 1:
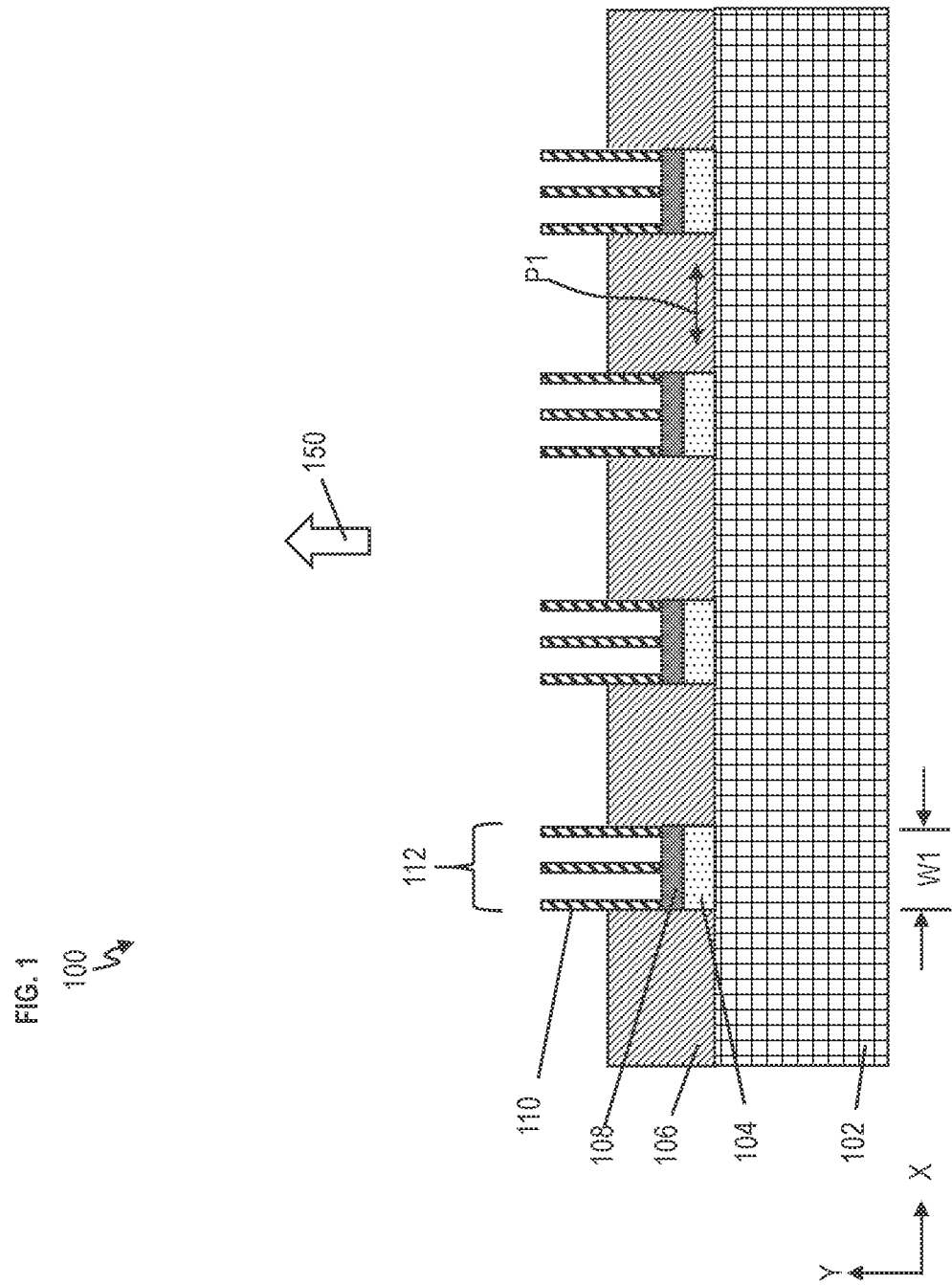
FIG. 1 depicts a cross-sectional view of a semiconductor device according to embodiments of the invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the embodiments of the invention, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, bonding two substrates (e.g., two wafers) is an essential step in three-dimensional (3D) integration. The size of electrical contacts between substrates is not scaling as fast as chip size. Two common techniques for substrate bonding occur in situations where electrical connection is established via bonding itself and where electrical connection is established post bonding. When electrical connection is established via bonding, common bonding materials include solder, copper (Cu), and metal alloys, for example, germanium aluminum (GeAl). When electrical connection is established post-bonding, common materials include oxide and various polymers, and subsequently, electrical connections are made between the two substrate through use of conductive vias.

Solder or solder bumps are typically used in joining substrates. However, there are limitations on scaling using solder or solder bumps. Particularly, as the active areas of electronic packaging continuously scale down, the electrical solder bumps or fasteners tend to suffer from severe performance and reliability degradation. During thermal compression joining, the thickness of solder compensates for wafer wrapping by, for example, spilling over or expanding laterally. The scaling of solder bump diameter and pitch has limitations in that it is more difficult to plate high aspect ratio solder bumps and the lateral expansion of solder bumps after thermal compression joining limits pitch scaling.

Turning now to an overview of the aspects of the invention, one or more embodiments of the invention address the above-described shortcomings of the prior art by providing semiconductor devices and methods of forming semiconductor devices using high aspect ratio vertical metal nanowires. The vertical nanowires are positioned on the faces of two opposing substrates that are to be bonded together. The two substrates are compressed together such that the vertical nanowires entangle to establish electrical contacts (e.g., physically and electrically connect). Known methods for growing vertical metal nanowires via templates or field assistance can be used at temperatures compatible with complementary metal-oxide-semiconductor (CMOS) processes. Compressible material, such as polymers, on non-electrical contact areas provide mechanical strength after bonding.

Figure 2:
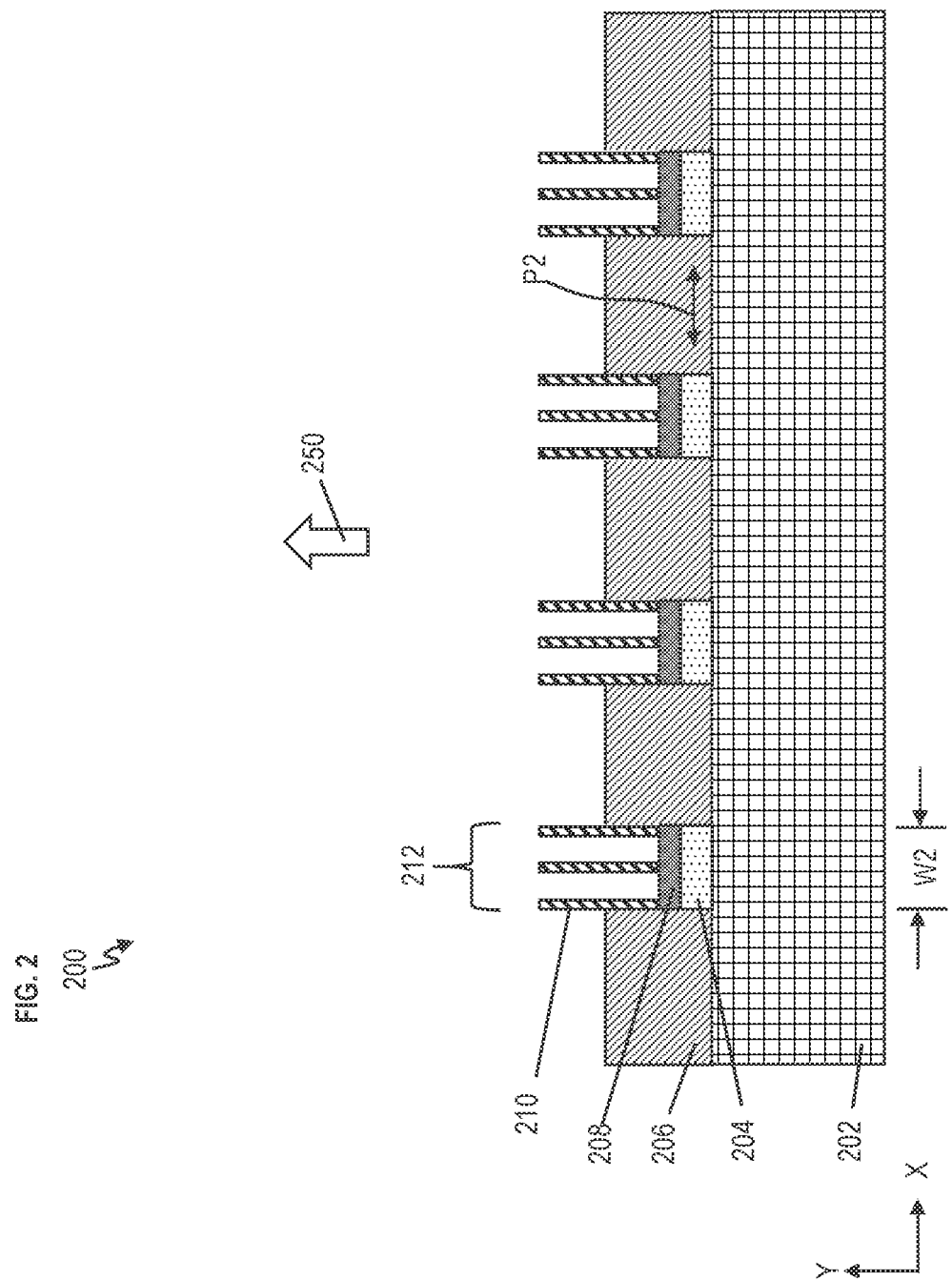
FIG. 2 depicts a cross-sectional view of a semiconductor device according to embodiments of the invention.

Turning now to a more detailed description of aspects of the present invention, FIG. 1 depicts a cross-sectional view of a semiconductor device 100 according to embodiments of the invention. FIG. 2 depicts a cross-sectional view of a semiconductor device 200 according to embodiments of the invention. The semiconductor devices 100 and 200 are formed using standard lithographic processes.

The semiconductor device 100 includes a substrate or wafer 102 while the semiconductor device 200 includes substrate or wafer 202. The substrates 102, 202 can encompasses semiconductor materials conventionally used in the semiconductor industry from which to make electrical devices. In embodiments of the invention, the starting substrate can be a semiconductor-on-insulator (SOI) substrate, which already includes the buried oxide layer. Alternatively, the starting substrate can be a bulk semiconductor including a sole semiconductor material or a combination of two or more semiconductor materials. The semiconductor material can include one or more monocrystalline silicon materials, such as the relatively pure or lightly impurity-doped monocrystalline silicon materials typically used in the semiconductor industry, as well as polycrystalline silicon materials, wherein silicon can be mixed with other elements such as carbon and the like. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. The semiconductor material also includes other materials such as relatively pure and impurity-doped gallium arsenide, germanium, gallium arsenide, gallium nitride, cadmium telluride, and zinc selenide, zinc oxide, glass, and the like. The substrate 102 can be a monocrystalline silicon material. The substrate 102, 202 can be a bulk silicon wafer or can be a thin layer of silicon disposed over an insulating layer (SOI) that, in turn, can be supported by a carrier wafer. The substrate 102, 202 can be material consisting essentially of III-V compound semiconductors. Other suitable substrates can include II-VI compounds.

Electrical bonding sites 104 are formed on the substrate 102 and electrical bonding sites 204 are formed on the substrate 202. The material of the electrical bonding sites 104, 204 can be respectively deposited on the substrates 102, 202 and patterned accordingly. The electrical bonding sites 104, 204 are made of and/or include electrically conductive material. Examples of conductive material suitable for the electrical bonding sites 104, 204 can include gold, aluminum, copper, silver, titanium, etc., along with other metals and metal alloys.

The electrical bonding sites 104, 204 can be electrical contacts or electrical pads which are electrically connected to electrical circuits (generally depicted as electrical circuit 602 in FIG. 6 and electrical circuit 702 in FIG. 7) and/or part of electrical circuits (such as integrated circuits (ICs)) as understood by one skilled in the art. The bonding sites 104, 204 can be representative of any electrical contact/pad used normally with solder or solder bumps when joining wafers using, for example, flip chip technology in the state-of-the-art. However, the pitch P1 between the bonding sites 104 and pitch P2 between the bonding sites 204 is much smaller than the state-of-the-art, as discussed further below.

A catalyst 108 is formed on the bonding sites 104, and the catalyst 108 is used to grow vertical nanowires 110. Similarly, a catalyst 208 is formed on the bonding sites 204, and the catalyst 208 is used to grow vertical nanowires 210. Each group of vertical nanowires 110 is in a cluster 112 on the respective bonding sites 104, and each group of vertical nanowires 210 is in a cluster 212 on the respective bonding sites 204. Although FIG. 1 depicts the vertical nanowires 110 optionally growing in situ from the catalyst 108 and FIG. 2 depicts the vertical nanowires 210 optionally growing in situ from the catalyst 208, the catalysts 108, 208 are not present on the respective bonding sites 104, 204 in some implementations. Instead, the vertical nanowires 110 can be grown separately (i.e., not on the substrate 102), and subsequently, the nanowires 110 can be placed directly on or transfer to the bonding sites 104 with no catalyst 108 present. Likewise, the vertical nanowires 210 can be grown separately (i.e., not on the substrate 202), and subsequently, the nanowires 210 can be placed directly on or transferred to the bonding sites 204 with no catalyst 108 present. It should be appreciated that embodiments of the invention are not meant to be limited by the method used to grow nanowires, which is well-known in the art.

The catalysts 108, 208 can be, for example, gold. Other example materials for the catalysts 108, 208 can include Pt. It is beneficial for the catalyst to be a conductive material. In some implementations, the catalyst 108, 208 can be removed after the vertical nanowires 110, 210 are grown. For example, the catalyst 108, 208 can be removed by wet etch.

Known methods for growing vertical metal nanowires via templates or field assistance can be used, at temperatures compatible with complementary metal-oxide-semiconductor (CMOS) processes. For growing nanowires (or carbon nanotubes (CNT)) in situ, a typical method uses chemical vapor deposition (CVD). In cases where any material/device on the substrate is temperature sensitive and not suitable for CVD, a transferring method can be used. One of the common methods of CNT growth, namely chemical vapor deposition CVD, involves high process temperatures 600-1000° C., which are incompatible with some back end microelectronic applications that can tolerate temperature of 400-500° C. As a result of this incompatibility, one can transfer the CVD grown nanowires/CNTs to another substrate at a lower temperature, as understood by one skilled in the art. An example of the transfer method can include growing carbon nanotubes in a desired pattern on a substrate, flipping the substrate upside-down, dipping the vertical carbon nanotubes in a conductive polymer such that the conductive polymer is attached on the bottom of the vertical carbon nanotubes, stacking the carbon nanotubes having the conductive polymer on another the substrate, and releasing the original substrate such that the carbon nanotubes are now anchored on the other substrate.

The vertical nanowires 110 and 210 are high-aspect-ratio vertical nanowires, which means the length is long relative to the width (or diameter). The vertical nanowires 110 and 210 can have a length to width ratio (1:w) of 5:1 (i.e., 5 to 1), 8:1, 10:1, 15:1, 20:1, 25:1, 50:1, 60:1, etc. This allows the vertical nanowires 110 in each cluster 112 to be utilized on bonding sites 104 that occupy a very small space, and the vertical nanowires 210 in each cluster 212 to be utilized on the bonding sites 204 that occupy a very small space.

The electrical bonding sites 104 have a pitch P1, which is the distance separating one bonding site 104 from the next one. The electrical bonding sites 204 have a pitch P2, which is the distance separating one bonding site 204 from the next one. The pitches P1 and P2 are the same or about the same such that the electrical bonding sites 104 and 204 will match each other when arranged opposite one another. Arrow 150 is illustrated to depict the top face of semiconductor device 100 while arrow 250 is illustrated to depict the top face of semiconductor device 200. The pitches P1 and P2 can be about 5 micrometers or microns (µm) and/or as small as 5 µm. The pitches P1 and P2 can range from about 5-10 µm. The width W1 of the bonding sites 104 and the width W2 of the bonding sites 204 can each be, for example, 2 µm, thereby making the width of each nanowire cluster 112, 212 about 2 µm. The widths W1 and W2 can each range from about 2-10 µm. Each of the vertical nanowires 110, 210 can have a height of about 30 µm or more. There can be some applications where shorter vertical nanowires are used.

The vertical nanowires 110 and 210 can be, for example, silicon, germanium, cobalt, silver, etc. The vertical nanowires 110 and 210 are generally metal. The vertical nanowires 110 and 210 can be doped to improve or increase conductivity. Additionally, the vertical nanowires 110 and 210 can be a carbon nanotube coated with metal. When the vertical nanowires 110 and 210 are grown separately and then transferred to the respective bonding sites 104, 204, the vertical nanowires 110 and 210 (which might be carbon nanotubes) are coated with a metal.

The semiconductor device 100 includes a compressible material 106 formed on the substrate 102, such that the compressible material 106 is not formed on top of the bonding sites 104, not formed on top of the catalyst 108 (if present), and not formed on the vertical nanowires 110. Similarly, the semiconductor device 100 includes a compressible material 206 formed on the substrate 202, such that the compressible material 206 is not formed on top of the bonding sites 104, not formed on top of the catalyst 208 (if present), and not formed on the vertical nanowires 210. The compressible material 106, 206 is not electrically conductive. The compressible material 106, 206 can be a polymer, such as, for example, a curable polyimide. Other examples of the compressible material 106, 206 include acrylic, polydimethylsiloxane (PDMS), etc. The compressible material 106, 206 is designed to be compressed when compressive force is applied. The compressible material 106, 206 (on non-electrical contact areas) is designed to provide mechanical strength after bonding.

The compressible material 106 is formed to fill in the empty space between each nanowire cluster 112 in semiconductor device 100. Similarly, the compressible material 206 is formed to fill in the empty space between each nanowire cluster 212 in semiconductor device 200. The compressible material 106 is below the top of the vertical nanowires 110, and the compressible material 206 is below the top of the vertical nanowires 210. This provided room for compression.

Figure 3:
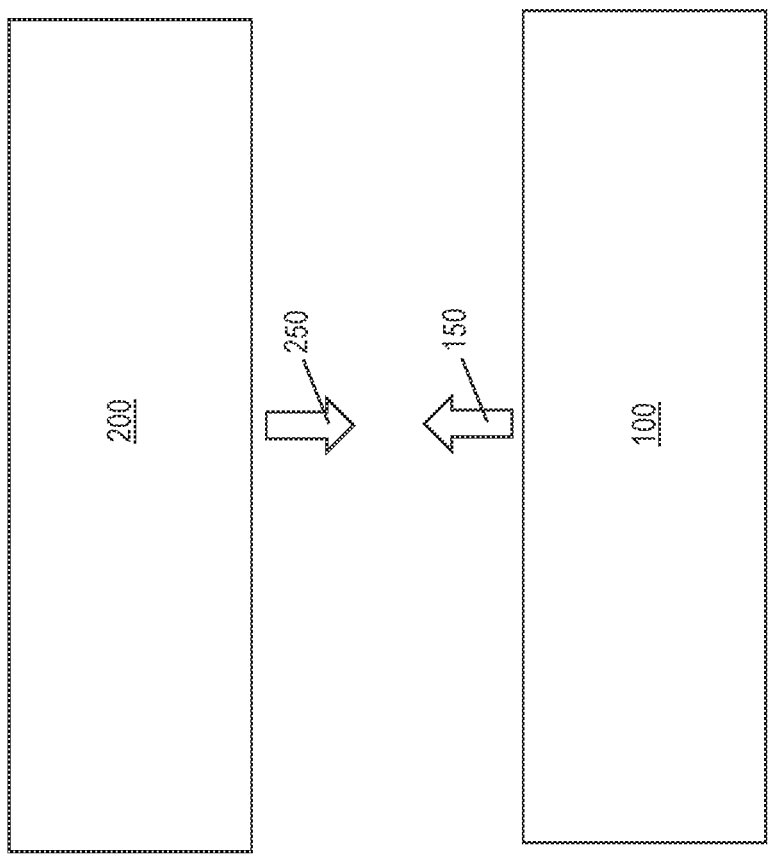
FIG. 3 depicts a simplified diagram depicting the combining of two semiconductor devices according to embodiments of the invention.

FIG. 3 depicts a simplistic view of combining two semiconductor device 100 and 200 according to embodiments of the invention. As in flip chip technology, one of the semiconductor devices 100 and 200 is turned upside down such that its top face is facing downward while the top face of the other is facing upward. The top face shown by arrow 150 of semiconductor device 100 is aligned and joined to the top face shown by arrow 250 of semiconductor device 200, as depicted in FIGS. 4 and 5.

Figure 4:
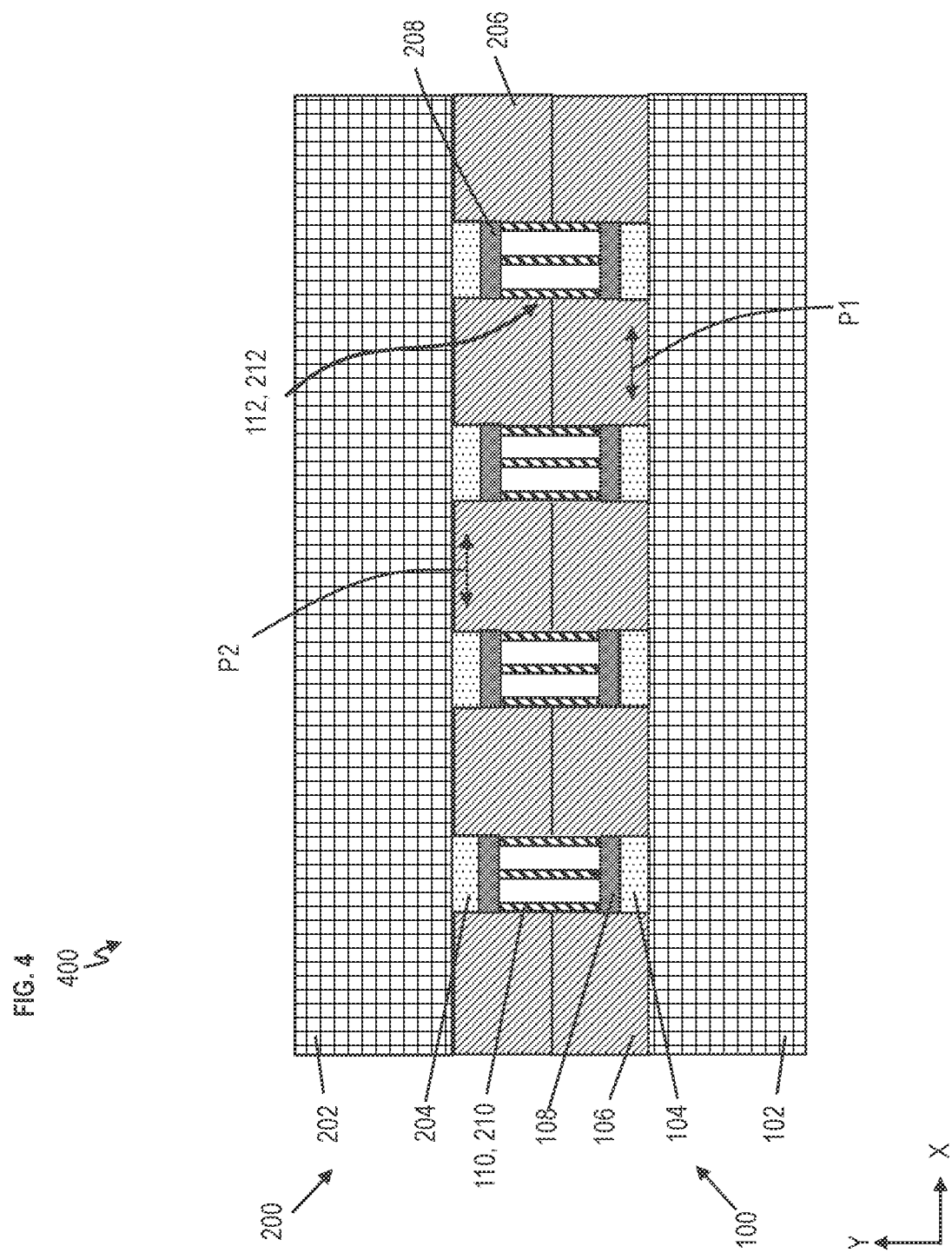
FIG. 4 depicts a cross-sectional view of one device joined to another device in a manner that forms a combined semiconductor device according to embodiments of the invention.

FIG. 4 depicts a cross-sectional view of one device joined to another device to form semiconductor device 400 according to embodiments of the invention. The vertical nanowires 110 of semiconductor device 100 are physically and electrically connected to the opposing vertical nanowires 210 of semiconductor device 200. The vertical nanowires 110 and 210 are physically connected by van der Waals forces, and the vertical nanowires 110 and 210 conduct electricity (or signals) back and forth between electrical circuits in semiconductor device 100 and 200. FIG. 4 represents an example in which some amount, which can be a trace amount, of catalyst 108 and/or 208 is present at the respective bonding sites 104 and 204.

Figure 5:
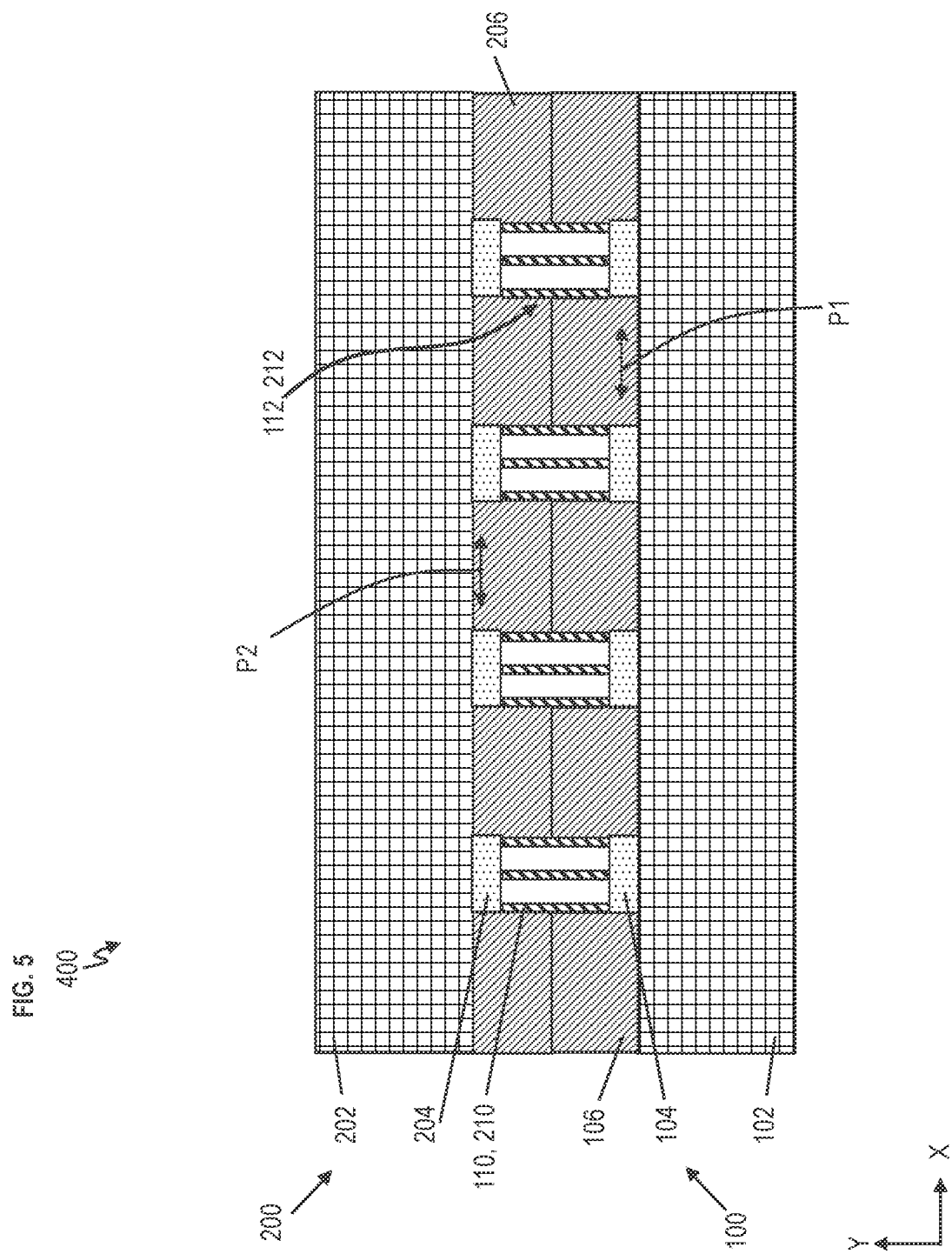
FIG. 5 depicts a cross-sectional view of one device joined to another device in a manner that forms a combined semiconductor device according to embodiments of the invention.

FIG. 5 depicts a cross-sectional view of one device joined to another device to form semiconductor device 400 according to embodiments of the invention. FIG. 5 represents an example in which no catalyst 108 and 208 were used to form respective vertical nanowires 110 and 210, but the vertical nanowires 110 and 210 were grown and transferred onto the respective semiconductor devices 100 and 200 using techniques well-known by one skilled in the art.

FIGS. 4 and 5 establish individual (for each clusters 112, 212) electrical contact simultaneously with the bonding operation using nanowires 110 and 210. Embodiments of the invention eliminate the need for bonding material, for example, such that no glue, adhesive, epoxy, solder, etc., is required to establish a physical bond between semiconductor devices 100 and 200, but rely on the entanglement of nanowires 110 and 210. Particularly, embodiments of the invention eliminate the need for bonding material in between individual vertical nanowires 110 in nanowire cluster 112 in FIG. 1 and bonding material in between individual vertical nanowires 210 in nanowire cluster 212 in FIG. 2. Although space is shown between nanowires 110 in nanowire cluster 112, there can be some individual nanowires 110 that are touching one another in the nanowire cluster 112. Similarly, although space is shown between nanowires 210 in nanowire cluster 212, there can be some individual nanowires 210 that are touching one another in the nanowire cluster 212.

FIG. 6 depicts a simplistic top view of the semiconductor device 100 illustrating bonding sites 104 individually and electrically connected to different areas on an electrical circuit 602 (integrated circuit) according to embodiments of the invention. FIG. 7 depicts a simplistic top view of the semiconductor device 200 illustrating bonding sites 204 individually and electrically connected to different areas on an electrical circuit 702 (integrated circuit) according to embodiments of the invention. Various layers that are generally part of an electrical circuit are not depicted for simplicity. Also, the nanowires 110 and 210, compressible materials 106 and 206, and catalysts 108 and 208 are not illustrated for simplicity. The electrical circuits 602 and 702 generally include and are representative of numerous circuit elements, including transistor devices, memory devices, processing devices, etc., and each of the can be electrically connected to its own one of the bonding sites 104 and bonding sites 204 respectively on the devices 100 and 200. Some of the circuit elements can be formed in portions of the substrate as understood by one skilled in the art.

As discussed and/or recognized herein, there are various technical benefits and advantages of joining/bonding two devices as discussed. The nanowires 110, 210 can be compressed, thereby compensating for wafer warpage. A wafer or substrate can be warped 50 µm, 100 µm, or more, and the nanowires 110 and 210 can be compressed to compensate for the wafer warpage (of both or one of the devices 100, 200), but the lateral extension/expansion of the nanowires 110 and 210 is much less than that of a solder bump. Regardless if the wafer is warped or not, the nanowires entangle and establish electrical contact without considerable lateral size expansion, thereby favoring pitch scaling (i.e., pitch reduction). As additional benefits, nanowires can be grown with a higher aspect ratio than plated solder, thereby favoring electrical contact scaling so that the electrical contact/pads/bonding sites can be made smaller with no issues.

According to embodiments of the invention, a method of fabricating a semiconductor device 400, 500 is provided. The method includes forming first nanowires 110 on a first substrate 102, the first nanowires 110 being electrically (and physically) coupled to one or more first electrical sites 104 on the first substrate 102. The method includes forming second nanowires 210 on a second substrate 202, the second nanowires 210 being electrically (and physical) coupled to one or more second electrical sites 204 on the second substrate 202. Also, the method includes electrically coupling the first nanowires 110 and the second nanowires 210 such that the one or more first electrical sites 104 are electrically coupled to the one or more second electrical sites 204.

Electrically coupling the first nanowires 110 to the second nanowires 210 includes: arranging the first substrate 102 and the second substrate 202 oppose each other such that the first nanowires are opposite the second nanowires, and compressing (or pressing) the first substrate 102 and the second substrate 202 together. Compressing the first substrate and the second substrate together causes a bond between the first nanowires 110 and the second nanowires 210. Ones of the first nanowires 110 and the second nanowires 210 are physically in contact. With respect to two opposing bonding sites 104 and 204, nanowires 110 are adjacent to (i.e., touching) nanowires 210 when the substrates 102 and 202 are joined. The nanowires 110 of one cluster 112 can be in front of, behind, and/or beside the nanowires 210 of one cluster 212 when the substrates 102 and 104 are joined. The first nanowires 110 and the second nanowires 210 are bonded together at least by van der Waal forces.

The first nanowires 110 and the second nanowires 210 are formed to have a high aspect ratio, such that a height of each of the first nanowires 110 and the second nanowires 210 is greater than its width/diameter by at least a ratio of 5 to 1.

Further, the method includes forming a first compressible material 106 on the first substrate 102 and a second compressible material 206 on the second substrate 202. In one case, the first compressible material 106 and second compressible material 206 are the same material. In another case, the first compressible material 106 and second compressible material 206 are different materials. Electrically coupling the first nanowires 110 and the second nanowires 210 causes the first compressible material 106 and the second compressible material 206 to be pressed together. The one or more first electrical sites 104 and the one or more second electrical sites 204 have opposing surfaces (i.e., opposing faces). The opposing surfaces of electrical sites 104 and 204 are free of the first and second compressible materials 106 and 206, respectively. The (top surfaces of) one or more first electrical sites 104, the one or more second electrical sites 204, the first nanowires 110, and the second nanowires 210 are free of bonding material.

According to embodiments of the invention, a method of fabricating a semiconductor device 400, 500 is provided. The method includes providing a first device 100 having first nanowires 110 on a first substrate 102, the first nanowires 110 being electrically coupled to one or more first electrical sites 104 on the first substrate 102. The method includes providing a second device 200 having second nanowires 210 on a second substrate 202, the second nanowires 210 being electrically coupled to one or more second electrical sites 204 on the second substrate 202. Also, the method includes joining the first nanowires 110 to the second nanowires 210 such that the one or more first electrical sites 104 are electrically coupled to the one or more second electrical sites 204.

Terms such as "epitaxial growth" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a semiconductor device, the method comprising:
    forming first nanowires on a first substrate, the first nanowires being electrically coupled to first electrical sites on the first substrate, each of the first electrical sites having a first width and a first material, first compressible material being on the first substrate and on side surfaces of the first material;
    forming second nanowires on a second substrate, the second nanowires being electrically coupled to second electrical sites on the second substrate, each of the second electrical sites being spaced apart by a separation distance and comprising a second material different from the second substrate, the second electrical sites being on a surface of the second substrate, the separation distance being greater than the first width, a second compressible material being on the second substrate and on side surfaces of the second material; and
    electrically coupling the first nanowires and the second nanowires such that the first electrical sites are electrically coupled to the second electrical sites, portions of the first compressible material being in direct contact with both the side surfaces of the first material and an opposing surface of the second compressible material.

2. The method of claim 1, wherein electrically coupling the first nanowires and the second nanowires comprises:
    arranging the first substrate and the second substrate to oppose each other such that the first nanowires are opposite the second nanowires, and
    compressing the first substrate and the second substrate together.

3. The method of claim 2, wherein compressing the first substrate and the second substrate together causes a bond between the first nanowires and the second nanowires.

4. The method of claim 1, wherein ones of the first nanowires and the second nanowires are physically in contact, the separation distance for the second electrical sites being as small as about 5 micrometers, the first width being about 2 micrometers.

5. The method of claim 1, wherein the first nanowires and the second nanowires are bonded together at least by van der Waal forces.

6. The method of claim 1, wherein the first nanowires and the second nanowires are formed to have a high aspect ratio comprising a height of each of the first nanowires and the second nanowires being greater than a width of each of the first nanowires and the second nanowires by at least a ratio of about 5 to about 1.

7. The method of claim 1, wherein electrically coupling the first nanowires and the second nanowires causes the first compressible material and the second compressible material to be pressed together.

8. The method of claim 1, wherein:
    the first electrical sites and the second electrical sites have opposing surfaces; and
    the opposing surfaces are free of the first and second compressible materials.

9. The method of claim 1, wherein the first electrical sites, the second electrical sites, the first nanowires, and the second nanowires are free of bonding material.

10. The method of claim 1, wherein the first compressible material comprises a polyimide.

11. The method of claim 1, wherein the first compressible material is selected from the group consisting of acrylic and polydimethylsiloxane (PDMS).

12. A semiconductor device comprising:
    first nanowires on a first substrate, the first nanowires electrically coupled to first electrical sites on the first substrate, each of the first electrical sites having a first width and a first material, first compressible material being on the first substrate and on side surfaces of the first material; and
    second nanowires on a second substrate, the second nanowires electrically coupled to second electrical sites on the second substrate, each of the second electrical sites being spaced apart by a separation distance and comprising a second material different from the second substrate, the second electrical sites being on a surface of the second substrate, the separation distance being greater than the first width, a second compressible material being on the second substrate and on side surfaces of the second material;
    wherein the first substrate opposes the second substrate such that the first nanowires at the first electrical sites are electrically connected to the second nanowires at the second electrical sites, portions of the first compressible material being in direct contact with both the side surfaces of the first material and an opposing surface of the second compressible material.

13. The semiconductor device of claim 12, wherein the first substrate and the second substrate are arranged to be opposite each other such that the first nanowires are opposite the second nanowires.

14. The semiconductor device of claim 12, wherein the first substrate and the second substrate are compressed together causing a bond between the first nanowires and the second nanowires.

15. The semiconductor device of claim 12, wherein ones of the first nanowires and the second nanowires are physically in contact.

16. The semiconductor device of claim 12, wherein the first nanowires and the second nanowires are bonded together at least by van der Waal forces.

17. The semiconductor device of claim 12, wherein the first nanowires and the second nanowires are formed to have a high aspect ratio comprising a height of each of the first nanowires and the second nanowires being greater than a width of each of the first nanowires and the second nanowires by at least a ratio of about 5 to about 1.

18. The semiconductor device of claim 12, wherein:
    the first compressible material and the second compressible material are pressed together;
    the first electrical sites and the second electrical sites have opposing surfaces; and the opposing surfaces are free of the first and second compressible materials.

19. The semiconductor device of claim 12, wherein the first electrical sites, the second electrical sites, the first nanowires, and the second nanowires are free of bonding material.

20. A method of fabricating a semiconductor device, the method comprising:

provinding a first device having first nanowires on a first substrate, the first nanowires being electrically coupled to first electrical sites on the first substrate, each of the first electrical sites comprising a first electrical pad, the first electrical pad having a first width and a first material, first compressible material being on the first substrate and on side surfaces of the first material, the first electrical pad of the first electrical sites being spaced apart from one another by a separation distance, the separation distance being greater than the first width;

providing a second device having second nanowires on a second substrate, the second nanowires being electrically coupled to second electrical sites on the second substrate, each of the second electrical sites comprising a second electrical pad having a second material, a second compressible material being on the second substrate and on side surfaces of the second material; and joining the first nanowires and the second nanowires such that the first electrical pad of the first electrical sites is electrically coupled to the second electrical pad of the second electrical sites, portions of the first compressible material being in direct contact with both the side surfaces of the first material and an opposing surface of the second compressible material.

* * * * *